United States Patent
Lee

(10) Patent No.: US 7,626,885 B2
(45) Date of Patent: *Dec. 1, 2009

(54) COLUMN PATH CIRCUIT

(75) Inventor: Sang Kwon Lee, Yongin-si (KR)

(73) Assignee: Hynix Semiconductor Inc., Icheon-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/190,281

(22) Filed: Aug. 12, 2008

(65) Prior Publication Data

US 2009/0040845 A1    Feb. 12, 2009

Related U.S. Application Data

(63) Continuation of application No. 11/275,595, filed on Jan. 18, 2006, now Pat. No. 7,428,186.

(30) Foreign Application Priority Data

Apr. 7, 2005    (KR) ............................... 2005-29108

(51) Int. Cl.
  *G11C 8/18*    (2006.01)
(52) U.S. Cl. .................................. 365/233.5
(58) Field of Classification Search ............. 365/233.5, 365/230.08, 193, 238.5, 230.06, 233.1
See application file for complete search history.

(56) References Cited

U.S. PATENT DOCUMENTS

| | | | |
|---|---|---|---|
| 4,445,204 A * | 4/1984 | Nishiguchi | 365/189.19 |
| 5,333,300 A * | 7/1994 | Fandrich | 711/103 |
| 5,768,215 A | 6/1998 | Kwon et al. | |
| 5,898,554 A * | 4/1999 | Schnetzka et al. | 361/18 |
| 5,991,230 A * | 11/1999 | Urakawa | 365/189.09 |
| 6,005,826 A | 12/1999 | Ahn et al. | |
| 6,111,814 A | 8/2000 | Schaefer | |
| 6,389,520 B2 | 5/2002 | Christenson | |
| 6,507,534 B2 | 1/2003 | Balluchi | |
| 6,564,284 B2 | 5/2003 | Christenson | |
| 6,631,094 B2 | 10/2003 | Ikeda | |
| 6,801,468 B1 | 10/2004 | Lee | |
| 7,057,970 B2 | 6/2006 | Kang | |
| 7,428,186 B2 | 9/2008 | Lee | |
| 2004/0015663 A1 | 1/2004 | Choi | |
| 2006/0227651 A1 | 10/2006 | Lee | |

* cited by examiner

*Primary Examiner*—J. H. Hur
*Assistant Examiner*—Douglas King
(74) *Attorney, Agent, or Firm*—Marshall, Gerstein & Borun LLP

(57) ABSTRACT

A column path circuit includes address transition detectors which detect level transition of page address signals, thereby outputting transition detection signals each having a predetermined enable period, respectively. A detection signal coupler logically operates on the transition detection signals respectively outputted from the address transition detectors, and outputs a signal representing the results of the logical operation. A ready signal generator outputs a strobe ready signal having a predetermined enable period in response to an enabled state of the signal outputted from the detection signal coupler. A strobe signal generator generates a read strobe signal and a page address strobe signal for latch of the page address signals in response to the strobe ready signal. Page address buffers are enabled by the page address strobe signal, and latch the page address signals, thereby buffering the page address signals, a page address decoder which decodes the buffered page address signals respectively outputted from the page address buffers. And, a column selection signal generator outputs column selection signals respectively corresponding to the decoded page address signals in response to the read strobe signal.

21 Claims, 12 Drawing Sheets

COLUMN PATH CIRCUIT

CROSS-REFERENCE TO RELATED APPLICATIONS

This patent is a continuation of U.S. Ser. No. 11/275,595 filed Jan. 18, 2006 now U.S. Pat. No. 7,428,186 the disclosure of which is hereby expressly incorporated for all purposes.

TECHNICAL FIELD

This patent relates to a column path circuit, and, more particularly, to a column path circuit which is used in a semiconductor memory device such as pseudo static random access memory (SRAM).

DESCRIPTION OF THE RELATED ART

Generally, a pseudo SRAM is a semiconductor memory which includes dynamic RAMs (DRAMs) as memory cells thereof, but operates in accordance with an operating scheme similar to that of an SRAM. That is, such a pseudo SRAM is a memory device which has the DRAM architecture of memory cells, but operates in accordance with an SRAM scheme.

FIG. 1 illustrates a configuration of a conventional column path circuit, in particular, a column path circuit included in a pseudo SRAM device to receive a page address signal from the outside of the column path circuit and to decode the received page address signal, thereby outputting a column selection signal. FIG. 2 is a timing diagram of signals used in the conventional column path circuit. Operation of the conventional column path circuit will be described with reference to the drawings.

As shown in FIG. 1, when page address signals page_address<0>, page_address<1>, page_address<2>, . . . are input to the column path circuit from the outside of the column path circuit, page address buffers 111, 112, 113, . . . buffer the input page address signals page_address<0>, page_address<1>, page_address<2>, . . . , respectively, and supply the buffered signals <page_add_out> to a page address decoder 130. The page address decoder 130 decodes the signals <page_add_out> from the page address buffers 111, 112, 113, . . . , thereby outputting decoded page address signals decoded_address<0>, decoded_address<1>, decoded_address<2>, . . . as shown in FIG. 2.

Meanwhile, the page address signals page_address<0>, page_address<1>, page_address<2>, . . . are also applied to address transition detectors 121, 122, 123, . . . , respectively. The address transition detectors 121, 122, 123, . . . detect level transition of the associated page address signals page_address<0>, page_address<1>, page_address<2>, . . . , thereby outputting transition detection signals atd<0>, atd<1>, atd<2>, . . . , respectively. The transition detection signals atd<0>, atd<1>, atd<2>, . . . are applied to a detection signal coupler 140 which, in turn, ORs the transition detection signals atd<0>, atd<1>, atd<2>, . . . , thereby outputting a signal atd_sum as shown in FIG. 2. The signal atd_sum is applied to a read strobe generator 150 which, in turn, outputs a read strobe signal read_strobe to latch the decoded page address signals decoded_address<0>, decoded_address<1>, decoded_address<2>, . . . . Here, the read strobe signal is a strobe signal or sync signal to be used as a reference when column selection signals are produced using the decoded page address signals.

The decoded page address signals decoded_address<0>, decoded_address<1>, decoded_address<2>, . . . are applied to a column selection signal generator 160 which also receives the read strobe signal read_strobe. The column selection signal generator 160 outputs column selection signals Yi<0>, Yi<1>, . . . respectively corresponding to the decoded page address signals decoded_address<0>, decoded_address<1>, decoded_address<2>, . . . . Each of the column selection signals Yi<0>, Yi<1>, . . . is generated in synchronization with the read strobe signal read_strobe, namely, the enabled period of the read strobe signal read$_{13}$strobe.

However, the above-mentioned conventional column path circuit has a problem in that, if the decoded page addresses are changed in the enabled period of the read strobe signal due to skew occurring for the page address signals input from the outside of the column path circuit, two different column selection signals may be generated for one read strobe signal. For example, as shown in FIG. 2, when the decoded page addresses decoded_address<0>, decoded_address<1>, decoded_address<2>, . . . are changed in the enabled period of the read strobe signal read_strobe due to skew occurring for the page address signals page_address<0>, page_address<1>, page_address<2>, . . . , the column selection signal generator 160 outputs two different column selection signals Yi<1> and Yi<3>. In this case, it is impossible to perform a normal data read operation because the two columns are selected.

SUMMARY OF THE INVENTION

A column path circuit is configured to newly perform latching and decoding of page address signals inputted from the outside of the column path circuit when level transition of at least one of the page address signals occurs in an enabled period of a read strobe signal due to skew occurring for the page address signals, and re-generating a read strobe signal, to generate column selection signals, thereby preventing two different column selection signals from being generated for one read strobe signal, and thus, enabling a normal data read operation.

In accordance with one aspect, a column path circuit may include a ready signal generator which outputs a strobe ready signal having a predetermined enable period in response to the level transition of page address signals, a reset signal generator which outputs a reset signal for generation of the read strobe signal and the page address strobe signal in response to the strobe ready signal, a read strobe output unit which outputs the read strobe signal and the page address strobe signal in response to the reset signal; and a column selection signal generating circuit which latches the page address signals, buffers the page address signals in response to the page address strobe signal and outputs column selection signals respectively corresponding to a decoded page address signals in response to the read strobe signal.

BRIEF DESCRIPTION OF THE DRAWINGS

The features and advantages of the present invention will become more apparent after reading the following detailed description when taken in conjunction with the drawings, in which.

DESCRIPTION OF THE PREFERRED EMBODIMENTS

Hereinafter, the present invention will be described in detail, in conjunction with exemplary embodiments. These embodiments are used only for illustrative purposes, and the present invention is not limited thereto.

Figure 1:
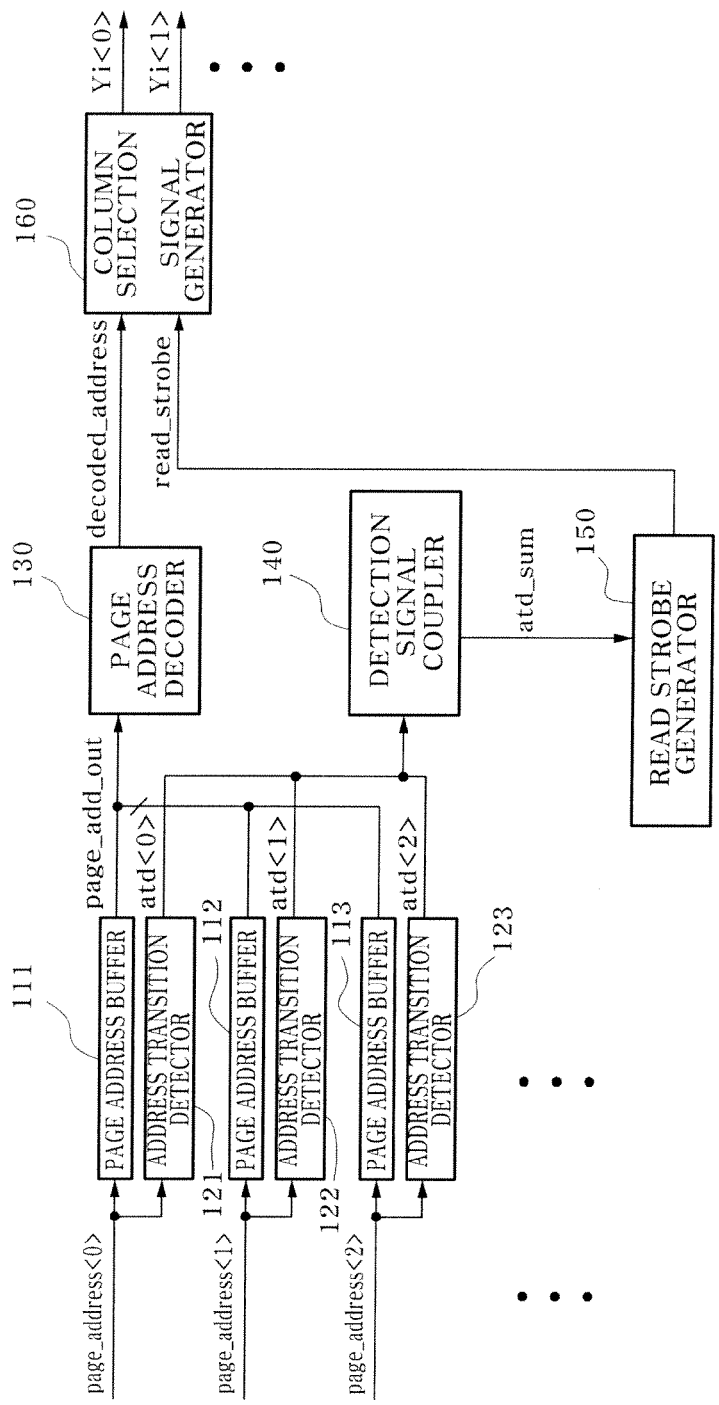
FIG. 1 is a block diagram illustrating a configuration of a conventional column path circuit.
Figure 2:
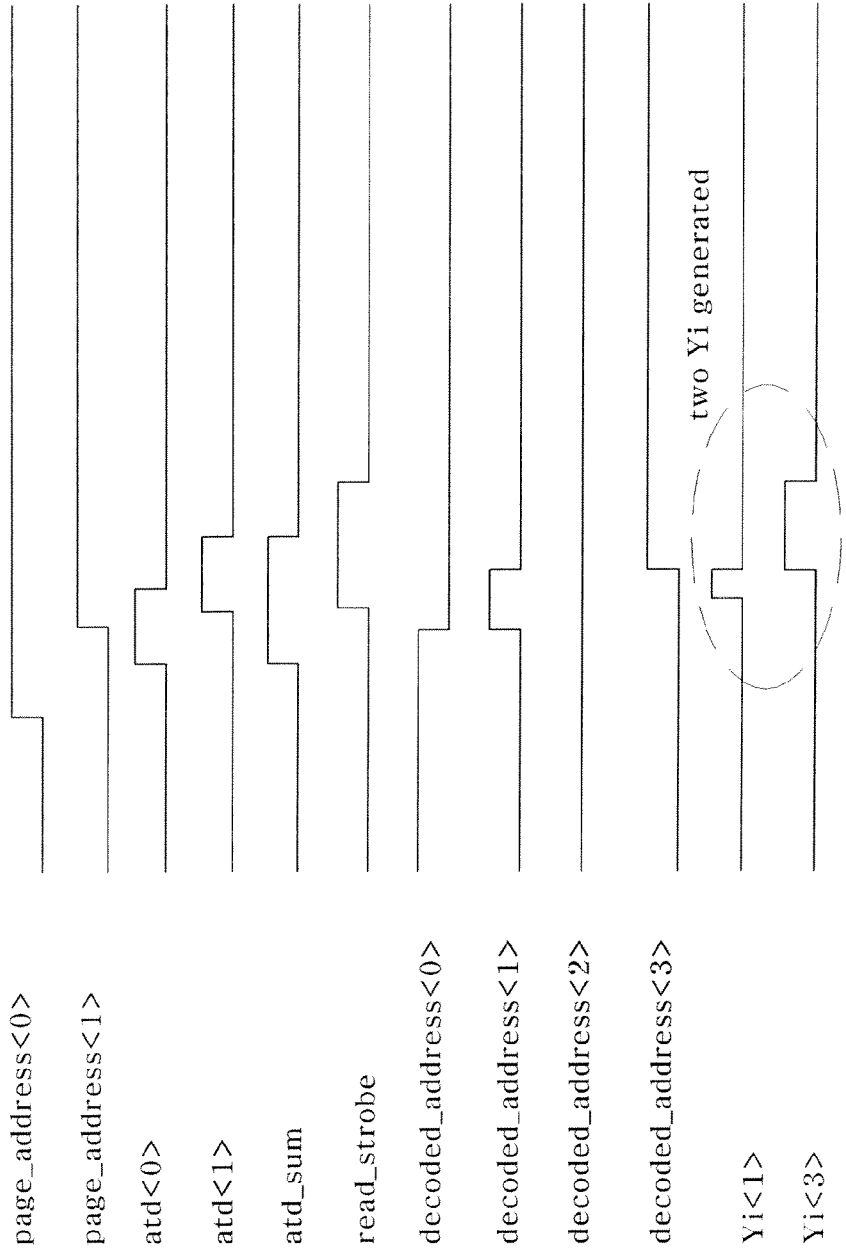
FIG. 2 is a timing diagram of signals used in the column path circuit.
Figure 3:
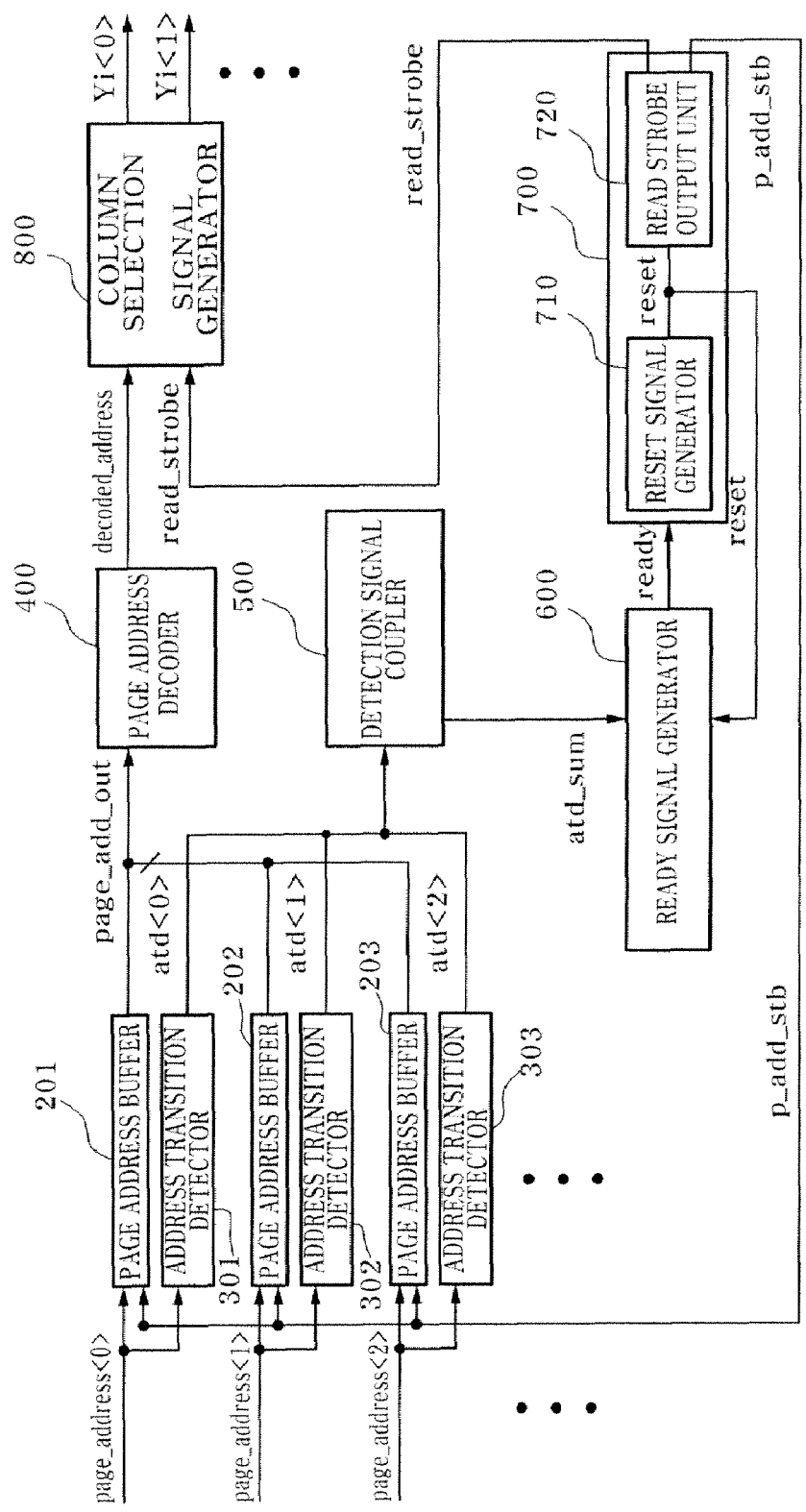
FIG. 3 is a block diagram illustrating a configuration of a column path circuit according to an embodiment of the present invention.
Figure 4:
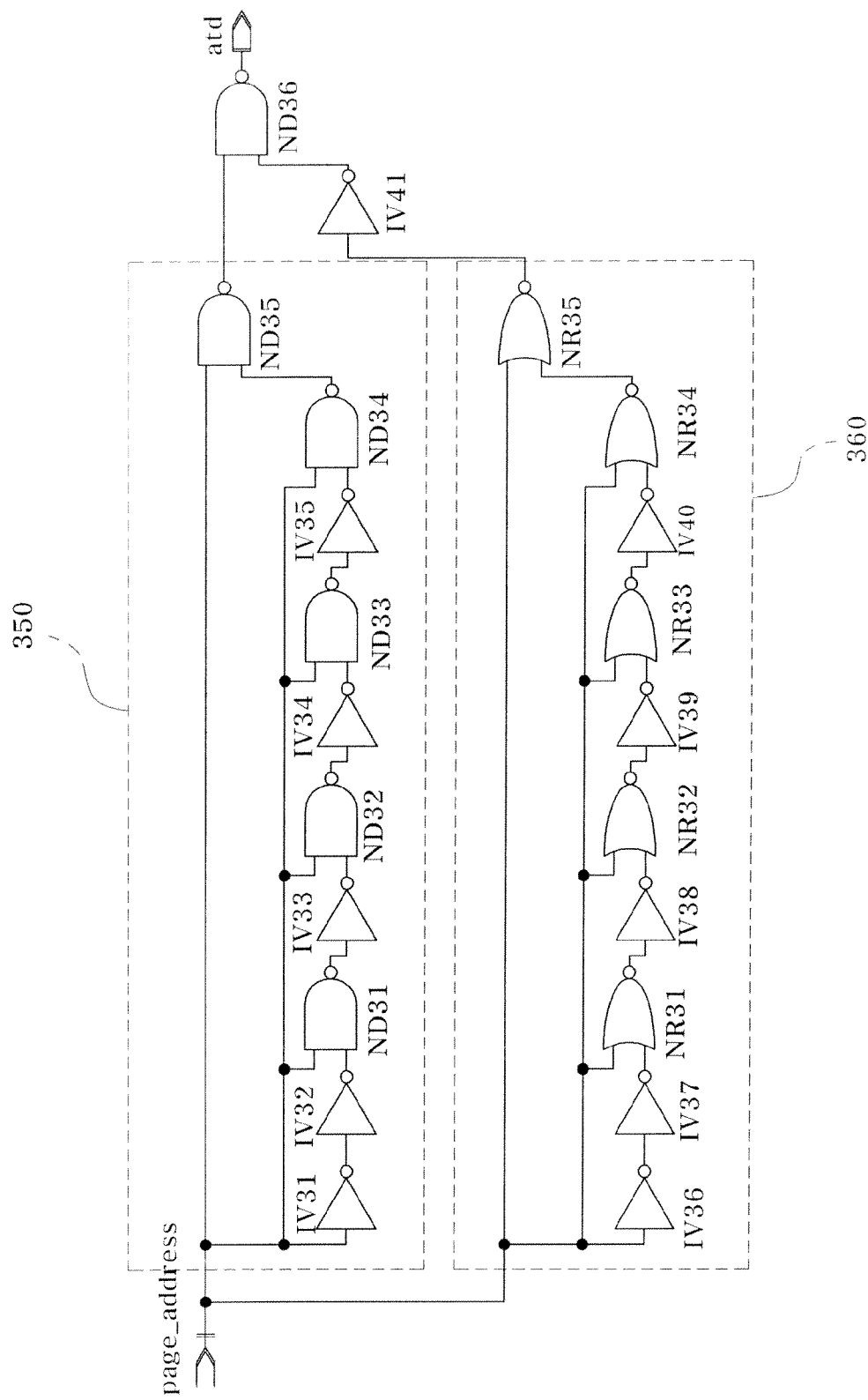
FIG. 4 is a circuit diagram illustrating an address transition detector included in the column path circuit according to the illustrated embodiment of the present invention.

FIG. 3 illustrates a configuration of a column path circuit according to an embodiment of the present invention. FIGS. 4 to 11 illustrate configurations of constituent elements of the column path circuit, respectively. The illustrated embodiment of the present invention will be described with reference to the drawings.

As shown in FIG. 3, the column path circuit according to the illustrated embodiment of the present invention includes a plurality of address transition detectors 301, 302, 303, . . . which detect level transition of page address signals page_address<0>, page_address<1>, page_address<2>, . . . , thereby outputting transition detection signals atd<0>, atd<1>, atd<2>, . . . each having a predetermined enabled period, respectively, a detection signal coupler 500 which ORs the transition detection signals atd<0>, atd<1>, atd<2>, . . . outputted from respective address transition detectors 301, 302, 303, . . . , thereby outputting a signal atd_sum, and a ready signal generator 600 which outputs a strobe ready signal ready having a predetermined enabled period in response to an enabled state of the signal atd_sum outputted from the detection signal coupler. The column path circuit also includes a strobe signal generator 700 which generates a predetermined read strobe signal read_strobe and a page address strobe signal p_add_stb for latch of the page address signals page_address<0>, page_address<1>, page_address<2>, . . . in response to the strobe ready signal ready, a plurality of page address buffers 201, 202, 203, . . . , which are enabled by the page address strobe signal p_add_stb, latch the page address signals page_address<0>, page_address<1>, page_address<2>, . . . , and buffer the page address signals page_address<0>, page_address<1>, page_address<2>, . . . , thereby outputting page address signals page_add_out, respectively, a page address decoder 400 which decodes the page address signals page_add_out respectively outputted from the page address buffers 201, 202, 203, . . . , thereby outputting decoded page address signals decoded_address<0>, decoded_address<1>, decoded_address<2>, . . . , and a column selection signal generator 800 which outputs column selection signals Yi<0>, Yi<1>, . . . respectively corresponding to the decoded page address signals decoded_address<0>, decoded_address<1>, decoded_address<2>, . . . in synchronization with the read strobe signal read_strobe.

The strobe signal generator 700 includes a reset signal generator 710 which outputs a reset signal reset for generation of the read strobe signal read_strobe and page address strobe signal p_add_stb in response to the strobe ready signal ready, and a read strobe output unit 720 which outputs the read strobe signal read_strobe and page address strobe signal p_add_stb in response to the reset signal reset.

Figure 7:
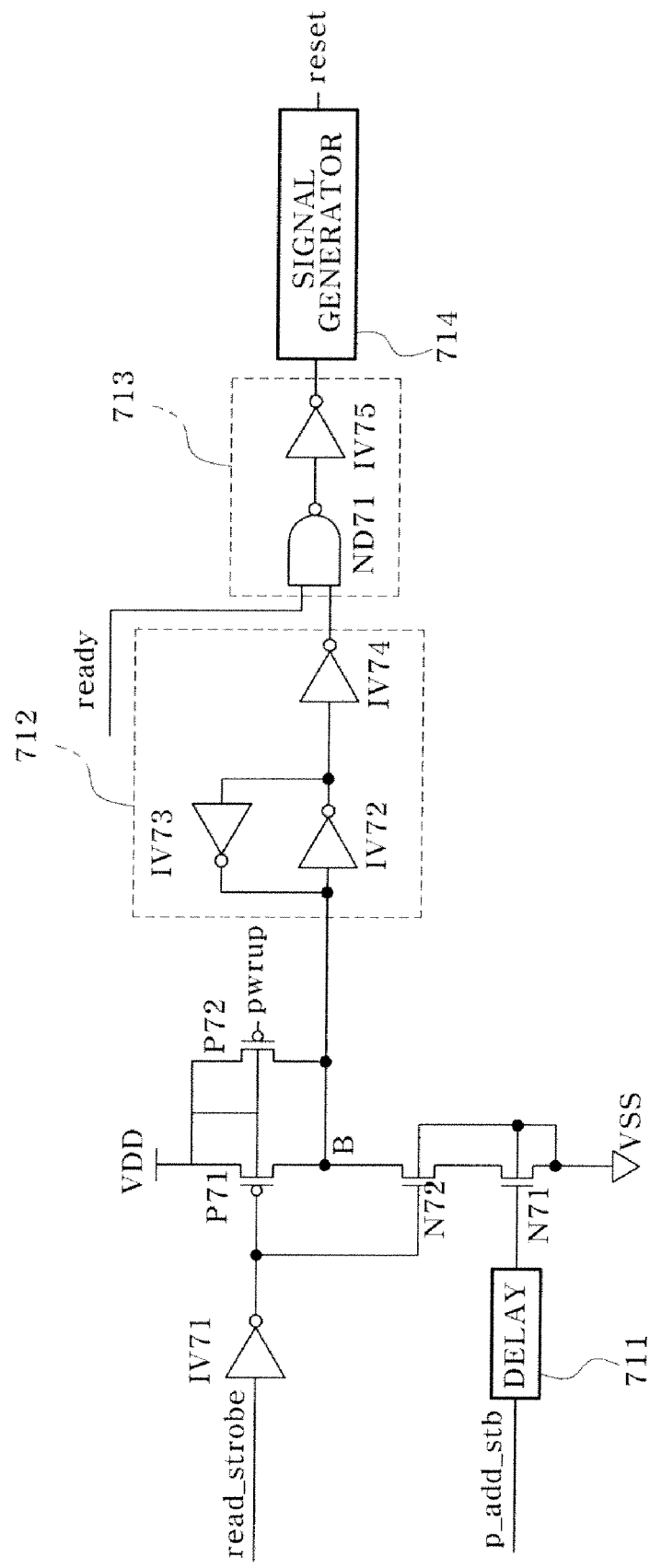
FIG. 7 is a circuit diagram illustrating a reset signal generator included in a strobe signal generator used in the column path circuit according to the illustrated embodiment of the present invention.

As shown in FIG. 7, the reset signal generator 710 includes a delay 711 which delays the page address strobe signal p_add_stb fed back thereto for a predetermined time, thereby outputting a delayed signal of the page address strobe signal p_add_stb, an n-channel metal oxide semiconductor (NMOS) transistor N71 which pulls down a node B in response to the signal outputted from the delay 711, and a p-channel MOS (PMOS) transistor P71 which pulls up the node B in response to an inverted signal of the read strobe signal read_strobe fed back thereto. The reset signal generator 710 also includes a logic unit 713 which ANDs a signal from the node B and the strobe ready signal ready, and a signal generator 714 which generates the reset signal reset in response to a signal outputted from the logic unit 713. The reset signal reset has a predetermined enabled period.

Figure 8:
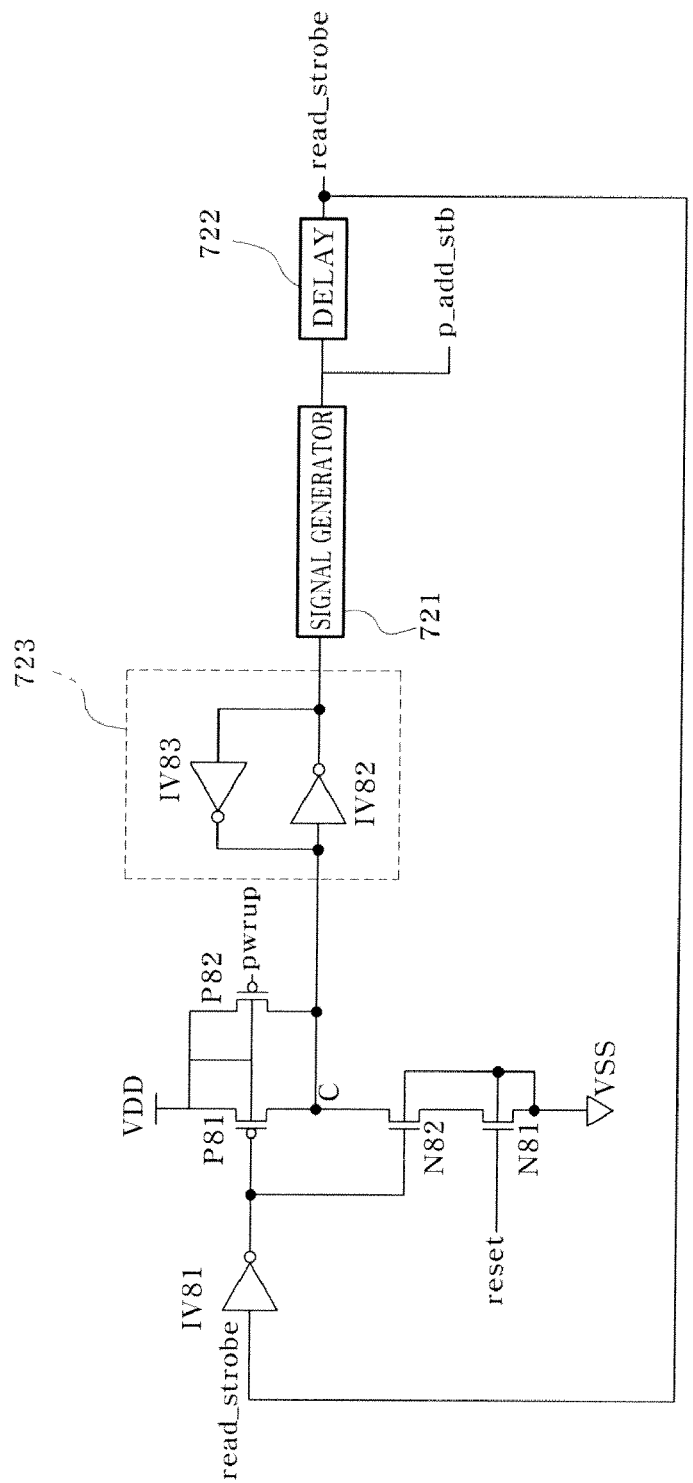
FIG. 8 is a circuit diagram illustrating a strobe signal generator included in the strobe signal generator used in the column path circuit according to the illustrated embodiment of the present invention.

As shown in FIG. 8, the read strobe output unit 720 includes an NMOS transistor N81 which pulls down a node C in response to the reset signal reset, a PMOS transistor P81 which pulls up the node C in response to an inverted signal of the read strobe signal read_strobe fed back thereto, and a latch 723 which latches a signal from the node C for a predetermined time. The read strobe output unit 720 also includes a signal generator 721 which outputs the page address strobe signal p_add_stb in response to a signal outputted from the latch 723, and a delay 722 which delays the page address strobe signal p_add_stb received from the signal generator 721 for a predetermined time, and outputs the delayed signal as the strobe signal read_strobe. The page address strobe signal p_add_stb has a predetermined enable period.

Figure 6:
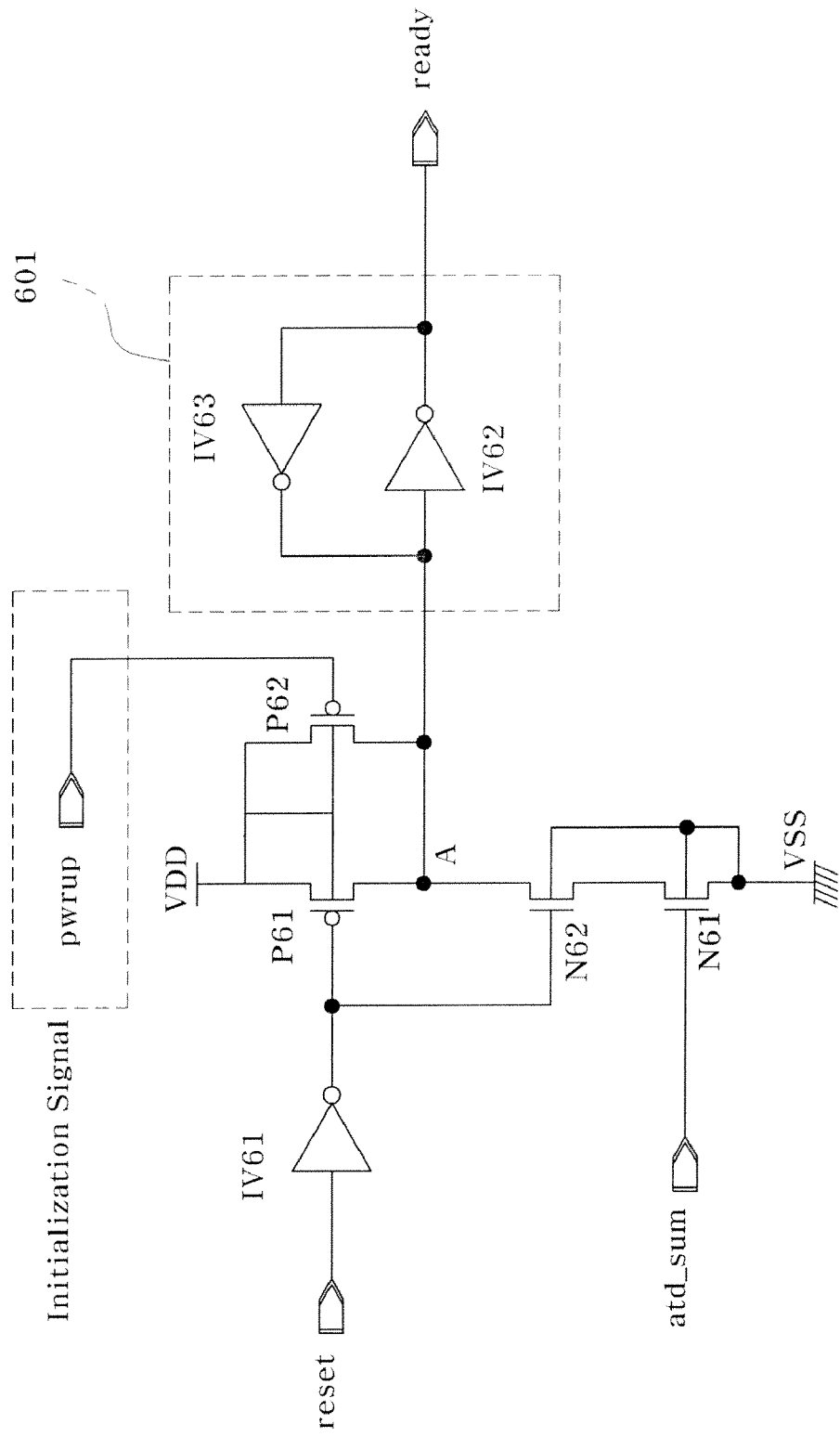
FIG. 6 is a circuit diagram illustrating a ready signal generator included in the column path circuit according to the illustrated embodiment of the present invention.

As shown in FIG. 6, the ready signal generator 600 includes an NMOS transistor N61 which pulls down a node A in response to the signal atd_sum outputted from the detection signal coupler 500, a PMOS transistor P61 which pulls up the node A in response to the inverted signal of the reset signal reset, and a latch 601 which latches a signal from the node A for a predetermined time, and outputs the latched signal as the strobe ready signal ready.

Figure 9:
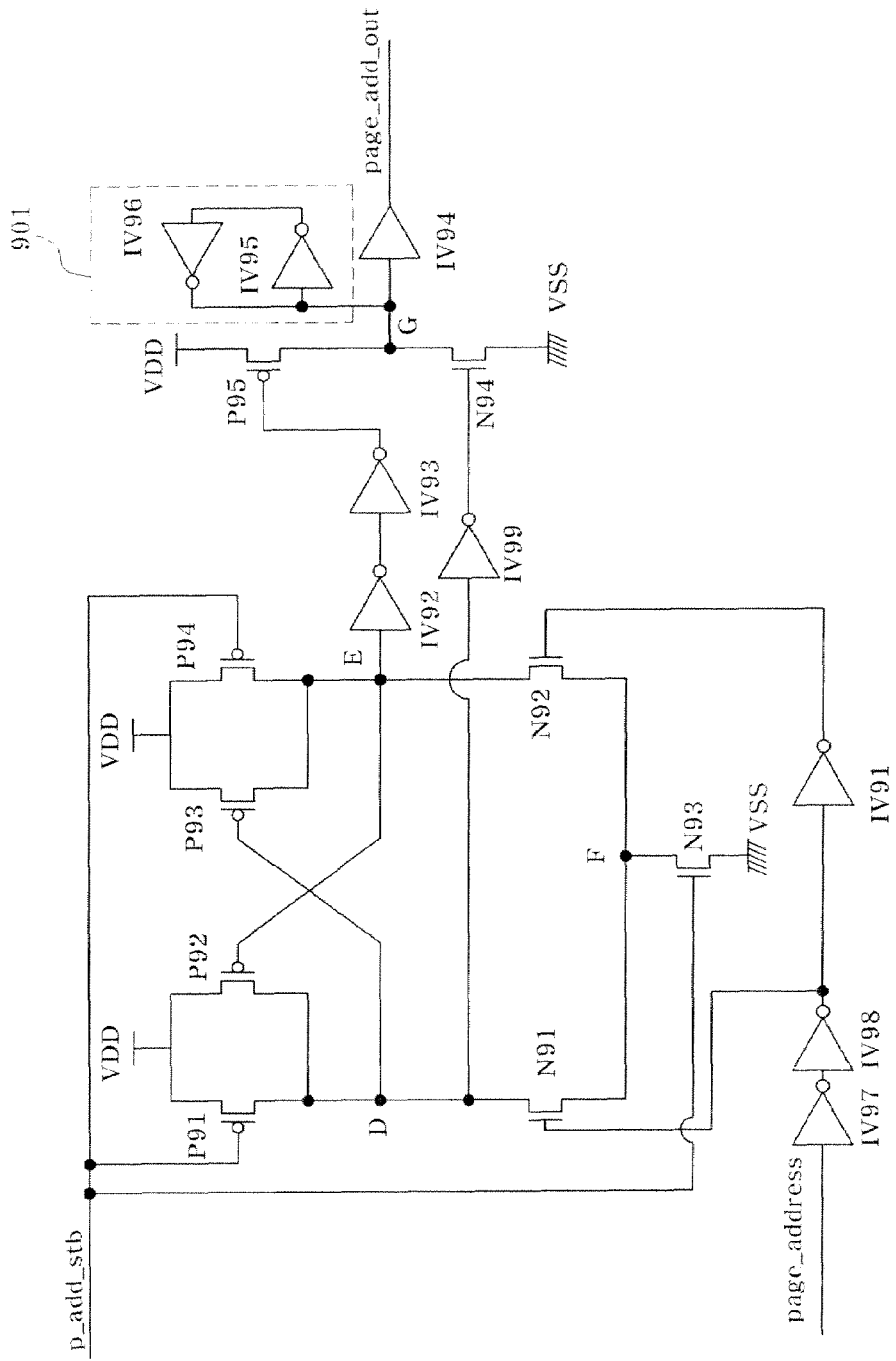
FIG. 9 is a circuit diagram illustrating a page address buffer included in the column path circuit according to the illustrated embodiment of the present invention.

As shown in FIG. 9, each of the page address buffers 111, 112, 113, . . . includes a PMOS transistor P91 which pulls up a node D in response to the page address strobe signal p_add_stb, a PMOS transistor P94 which pulls up a node E in response to the page address strobe signal p_add_stb, an NMOS transistor N91 which pulls down the node D in response to the associated page address signal page_address, and an NMOS transistor N92 which pulls down the node E in response to the associated page address signal page_address. Each of the page address buffers 111, 112, 113, . . . also includes a PMOS transistor P93 which pulls up the node E in response to a signal from the node D, an NMOS transistor N94 which pulls down a node G in response to an inverted signal of the signal from the node D, and a PMOS transistor P95 which pulls up the node G in response to a signal from the node E.

Operation of the column path circuit having the above-described configuration according to the illustrated embodiment will be described in detail with reference to FIGS. 3 to 12.

When page address signals page_address<0>, page_address<1>, page_address<2>, . . . are input to the column path circuit from the outside of the column path circuit, as shown in FIG. 3, THE page address buffers 201, 202, 203, . . . buffer the input page address signals page_address<0>, page_address<1>, page_address<2>, . . . , respectively, and supply the buffered signals <page_add_out> to a page address decoder 400. However, since the page address buffers 201, 202, 203, . . . are enabled in response to the page address strobe signal p_add_stb, they do not perform buffering operations before the page address strobe signal p_add_stb is transited to a high level, namely, an enabled state. Accordingly, the page address buffers 201, 202, 203, . . . do not perform buffering operations at the initial stage.

Meanwhile, the address transition detectors 301, 302, 303, . . . also receive the page address signals page_address<0>, page_address<1>, page_address<2>, . . . and detect level transition of the page address signals page_address<0>, page_address<1>, page_address<2>, . . . , thereby outputting transition detection signals atd<0>, atd<1>, atd<2>, . . . , respectively, as shown in FIG. 3. This will be described in detail with reference to FIG. 4. Each of the address transition detectors 301, 302, 303, . . . detects level transition of the associated page address signal, using a rising transition detector 350 and a falling transition detector 360, and outputs a transition detection signal atd having a predetermined enable period. The rising transition detector 350 senses level transition of the associated page address signal from a low level to a high level, whereas the falling transition detector 360 senses level transition of the associated page address signal from a high level to a low level.

First, where the page address signal page_address is in a low-level state, a high-level signal is outputted from a NAND gate ND35 of the rising transition detector 350. Meanwhile, a low-level signal is outputted from a NOR gate NR35 of the falling transition detector 360, so that a high-level signal is outputted from an inverter IV41 which receives the low-level signal from the NOR gate NR35. As a result, a low-level signal is outputted from a NAND gate ND36 which receives output signals from the NAND gate ND35 and inverter IV41. If the page address signal page_address is transited to a high level in this case, the signal input to one input terminal of the NAND gate ND35 is immediately transited to a high level. In this case, however, the signal input to the other input terminal of the NAND gate ND35 is maintained in a previous state, namely, a high-level level state, for a delay time caused by inverters IV31 to IV35. As a result, the NAND gate ND35 outputs is a low-level signal, so that the NAND gate ND36 Outputs a high-level signal as a transition detection signal atd. When the delay time elapses, the signal outputted from the NAND gate ND34 is transited to a low level. Accordingly, the NAND gate ND35 outputs a high-level signal, so that the transition detection signal atd outputted from the NAND gate ND36 is transited to a low level. Thus, when the page address signal page_address is transited from a low level to a high level, the associated address transition detector outputs a transition detection signal atd which is enabled for the delay time.

On the other hand, where the page address signal page_address is in a high-level state, the NAND gate ND35 outputs a high-level signal. Meanwhile, the NOR gate NR35 outputs a low-level signal, so that the inverter IV41 receiving the low-level signal from the NOR gate NR35 outputs a high-level signal. As a result, the NAND gate ND36 outputs a low-level signal. If the page address signal page_address is transited to a low level in this case, the signal input to one input terminal of the NOR gate NR35 is immediately transited to a low level. In this case, however, the signal input to the other input terminal of the NOR gate NR35, namely, the signal outputted from a NOR gate NR34, is maintained in a previous state, namely, a low-level state, for the delay time caused by the inverters IV36 to IV40. As a result, the NOR gate NR35 outputs a high-level signal, so that the inverter IV41 outputs a low-level signal. As a result, the NAND gate ND36 outputs a high-level signal as the transition detection signal atd. When the delay time elapses, the signal outputted from the NOR gate NR34 is transited to a high level. Accordingly, the NOR gate NR35 outputs a low-level signal, so that the inverter IV41 outputs a high-level signal. As a result, the transition detection signal atd outputted from the NAND gate ND36 is transited to a low level. Thus, when the page address signal page_address is transited from a high level to a low level, the associated address transition detector outputs a transition detection signal atd which is enabled for the delay time.

Figure 5:
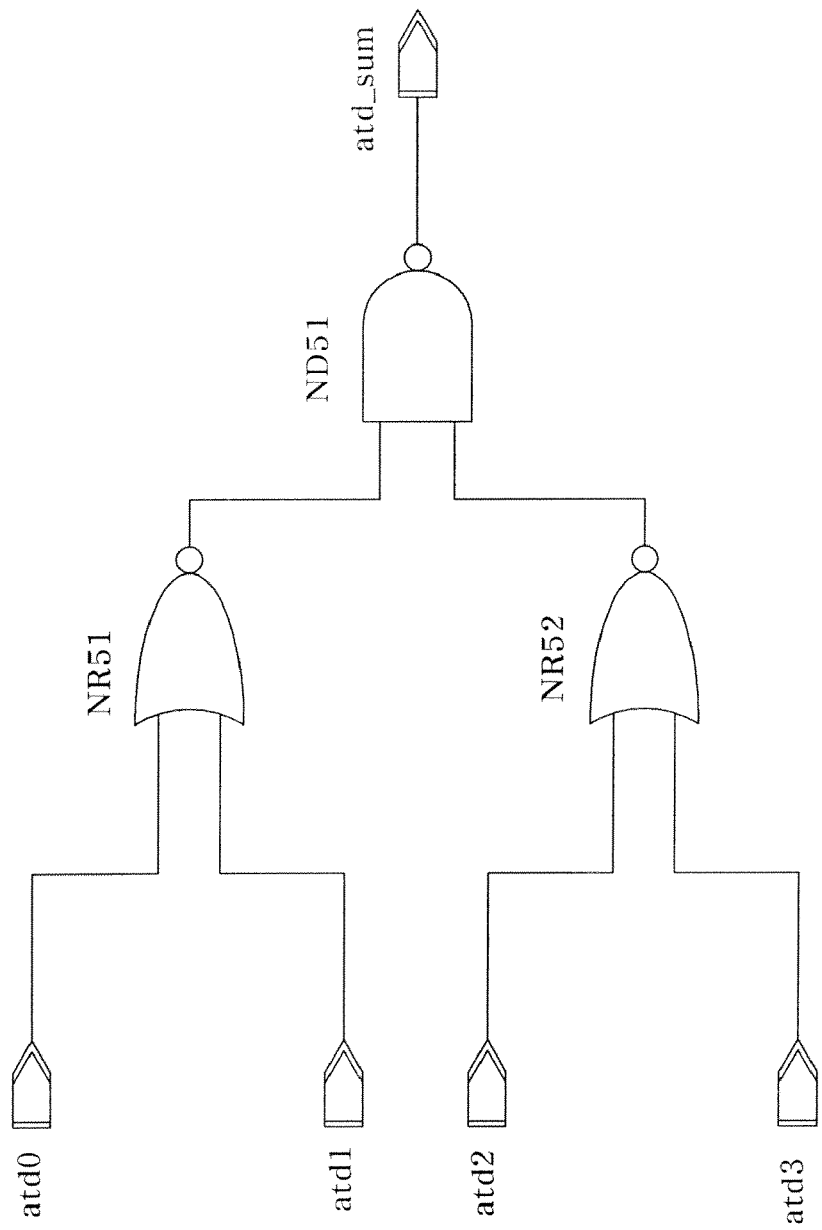
FIG. 5 is a circuit diagram illustrating a detection signal coupler included in the column path circuit according to the illustrated embodiment of the present invention.
Figure 12:
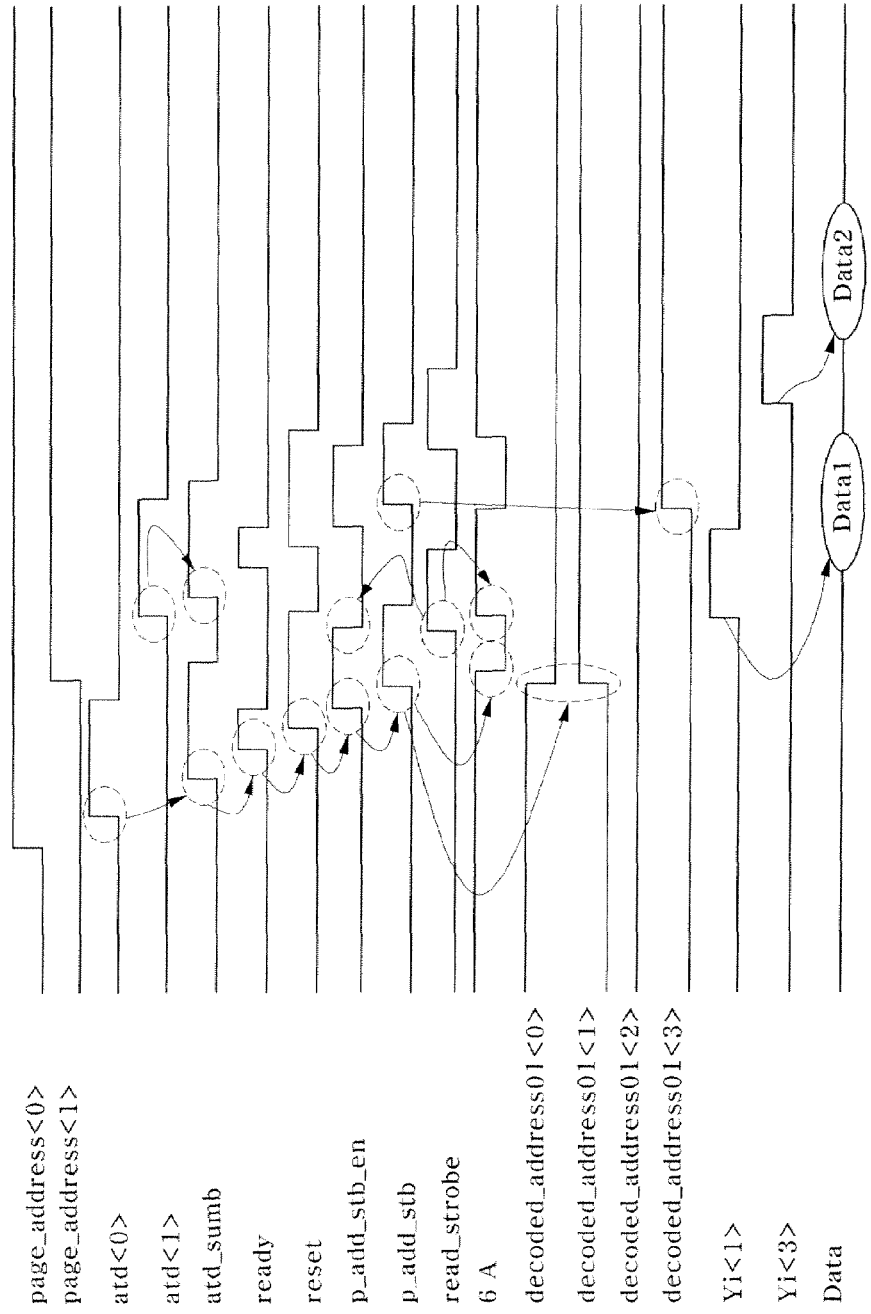
FIG. 12 is a timing diagram of signals used in the column path circuit according to the illustrated embodiment of the present invention.

The detection signal coupler 500 receives the transition detection signals atd<0>, atd<1>, atd<2>, . . . , and ORs the transition detection signals atd<0>, atd<1>, atd<2>, . . . , thereby outputting a signal atd_sum as shown in FIG. 12. FIG. 5 illustrates an example of a configuration implementing such an ORing operation. Referring to FIG. 5, when at least one of the transition detection signals atd<0>, atd<1>, atd<2>, . . . is transited to a high level, the NOR gate associated with the transited signal outputs a low level signal, so that the NAND gate receiving the low-level signal outputs a high-level signal as the signal atd_sum. Thus, ORing of the transition detection signals atd<0>, atd<1>, atd<2>, . . . is carried out.

The signal atd_sum from the detection signal coupler 500 is applied to the ready signal generator 600 which, in turn, outputs a strobe ready signal ready having a predetermined enable period in response to the signal atd_sum. The strobe ready signal ready serves as a ready signal for generation of a page address strobe signal p_add_stb and a read strobe signal read_strobe by the strobe signal generator 70 as will be described hereinafter. Operation of the ready signal generator 600 will be described hereinafter with reference to FIG. 6.

First, in an initial stage, a node A in a circuit of FIG. 6 is maintained in a high-level state in accordance with operation of a PMOS transistor P62 and a latch 601 enabled in response to an initialization signal pwrup. In this state, the reset signal reset fed back from the reset signal generator 710 is still maintained in a low-level state, namely, a disable state, so that an NMOS transistor N62 is in an ON state, and a PMOS transistor P61 is in an OFF state. Under this condition, when level transition occurs in at least one of the page address signals page_address<0>, page_address<1>, page_address<2>, . . . , to cause the signal atd_sum to be transited to a high level, an NMOS transistor N61 is turned on. As a result, the node A is transited to a low-level state, so that the strobe read signal ready is transited to a high level, namely, an enable state. This condition is maintained before the reset signal reset is transited to a high level, namely, an enable state, thereby causing the node A to be reset to a high level.

The strobe ready signal ready is applied to the strobe signal generator 700 which, in turn, outputs a read strobe signal read_strobe and a page address strobe signal p_add_stb, together with the reset signal reset. Operation of the strobe signal generator 700 will be described hereinafter with reference to FIGS. 7 and 8.

As show in FIG. 7, the strobe ready signal ready is inputted to one input terminal of a NAND gate ND71 included in the reset signal generator 710. In this state, the node B is in a high-level state in accordance with operation of a PMOS transistor P72 and a latch 712 enabled in response to an initialization signal pwrup. Accordingly, a high-level signal is input to one input terminal of a NAND gate ND71 included in the logic unit 713 via an inverter IV74 of the latch 712. Accordingly, when the strobe ready signal ready input to the other input terminal of the NAND gate ND71 has a high level, the signal outputted from the logic unit 713, which includes an inverter IV75 in addition to the NAND gate ND71, is transited from a low level to a high level. As a result, the signal generator 714 is enabled in response to the high-level signal from the logic unit 713, thereby outputting a reset signal reset having a predetermined enable period. Detailed operation of the signal generator 714 will be described hereinafter with reference to FIG. 10.

Figure 10:
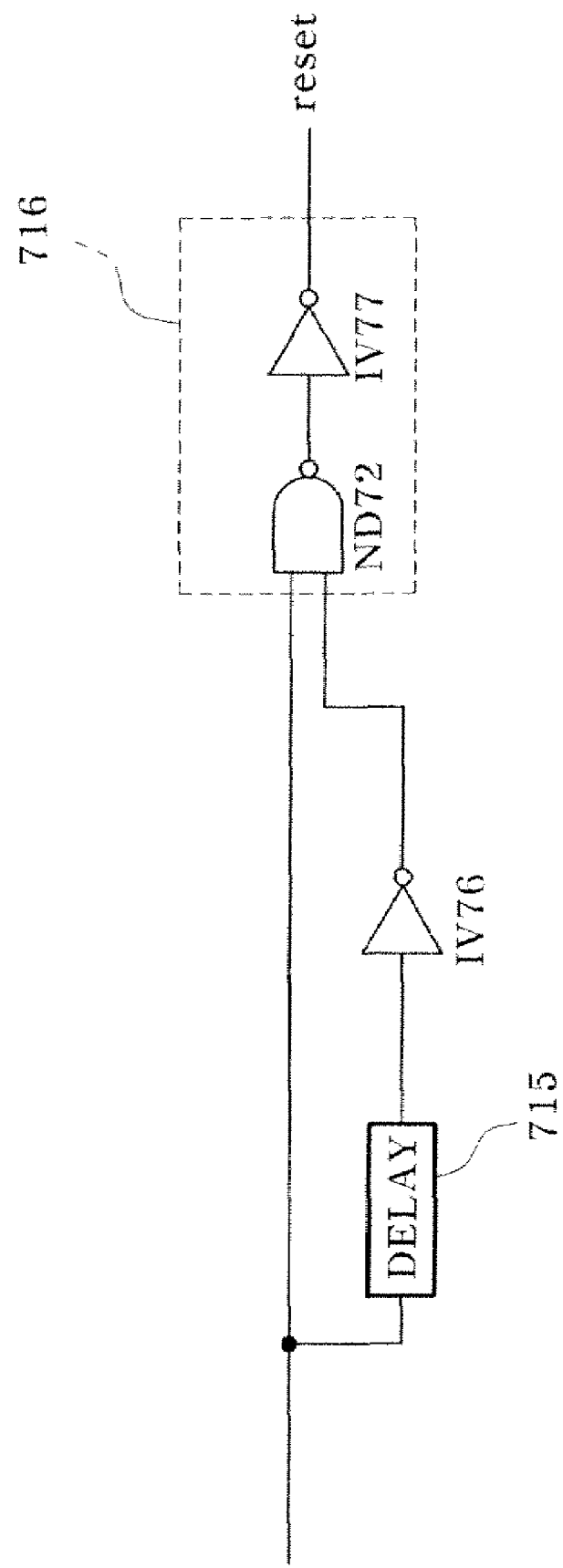
FIG. 10 is a circuit diagram illustrating a signal generator included in the reset signal generator.

The signal from the inverter IV75, which is input to the signal generator 714, is applied not only to one input terminal of a NAND gate ND72, but also to a delay 715, as shown in FIG. 10. Under the condition in which the strobe ready signal ready has a low level, and thus, the signal outputted from the inverter IV75 has a low level, a high-level signal form the inverter IV76 is input to the NAND gate ND72 which, in turn, outputs a high-level signal. In this state, accordingly, the reset signal reset outputted from the inverter IV77 has a low level. When the strobe ready signal ready is transited to a high level, namely, an enabled state, a high-level signal from the inverter IV75 is input to the signal generator 714.

Under this condition, the signal outputted from the inverter IV76 is still maintained in a previous state, namely, a high-level state, until the delay time caused by the delay 715 elapses. Accordingly, until the delay time elapses, the logic unit 716 receives high-level signals, thereby outputting a high-level signal. When the delay time elapses, the output signal from the inverter IV76 is transited to a low level, so that the output signal from the logic unit 716 is transited to a low level. Thus, the reset signal generator 710 outputs the reset signal reset having a predetermined enable period when the strobe ready signal ready is enabled, as shown in FIG. 12.

Meanwhile, when an enabled page address strobe signal p_add_stb from the read strobe output unit 720, which will be described hereinafter, is input to the delay 711 of the reset signal generator 710 shown in FIG. 7, the node B is transited to a low level, so that the logic unit 713 outputs a low-level signal. Accordingly, the reset signal reset outputted from the signal generator 714 is transited to a low level, namely, a disable state, as shown in FIG. 12. When the read strobe signal read_strobe is applied to an inverter IV71 of the reset signal generator 710, the node B is re-transited to a high level, so that the node B is returned to a state maintained before the strobe ready signal ready is input.

The reset signal reset is input to the NMOS transistor N81 of the read strobe output unit 720, as shown in FIG. 8. In this state, the read strobe signal read_strobe fed back to the read strobe output unit 720 is still maintained in a low-level state, namely, a disabled state. Accordingly, when the reset signal reset is transited to a high level, namely, an enabled state, the node C is pulled down to a low level, so that the signal generator 721 receives a high-level signal, thereby outputting a page address strobe signal p_add_stb having a predetermined enabled period. Detailed operation of the signal generator 721 will be described hereinafter with reference to FIG. 11.

Figure 11:
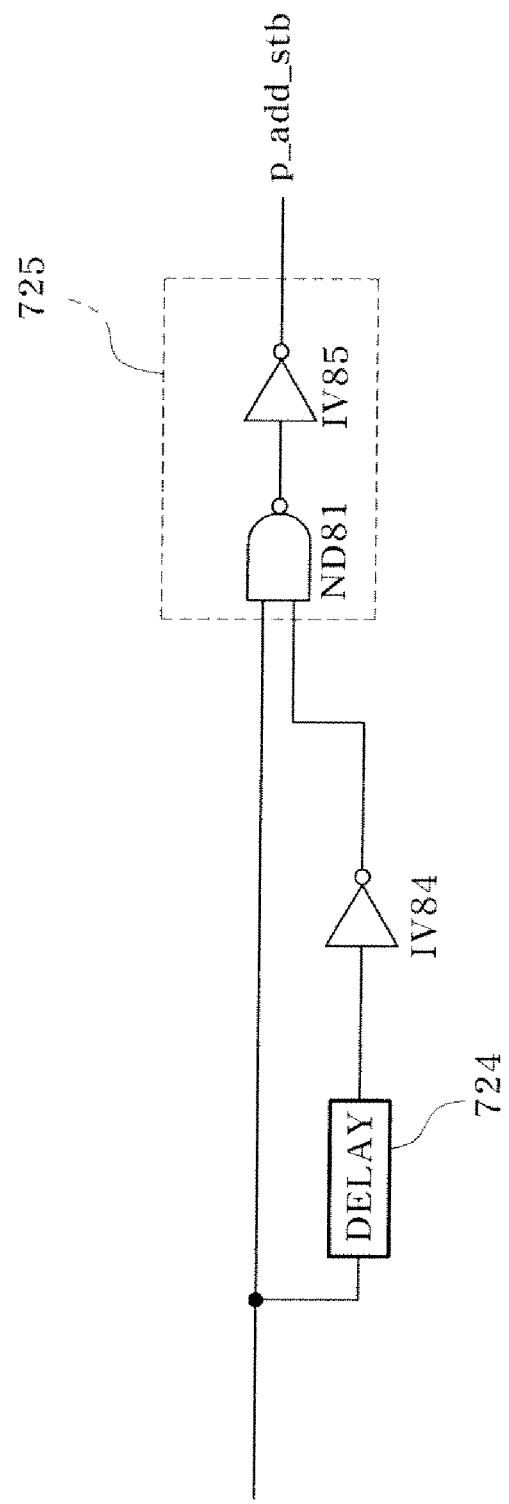
FIG. 11 is a circuit diagram illustrating a signal generator included in the read strobe output unit.

As shown in FIG. 11, the basic configuration of the signal generator 721 is identical to that of the signal generator 714 of the reset signal generator 710. Therefore, the signal generator 721 outputs a page address strobe signal p_add_stb having a predetermined enabled period in response to a high-level signal applied thereto in accordance with the same operation principle as the above-described operation principle of the signal generator 714. That is, in an initial stage, the node C in the circuit of FIG. 8 is maintained at a high-level state in accordance with operation of a PMOS transistor P82 and the latch 723 enabled in response to an initialization signal pwrup. Accordingly, the signal generator 721 receives a low-level signal, so that it is disabled. The reset signal reset is subsequently transited to a high level, namely, an enabled state, the signal generator 721 is enabled, thereby outputting a page address strobe signal p_add_stb enabled for a delay time caused by a delay 724 included in the signal generator 721 as shown in FIG. 11 (FIG. 12). As shown in FIG. 12, the page address strobe signal p_add_stb is output as a read strobe signal read_strobe after being delayed for a predetermined time by the delay 722.

Thus, the strobe signal generator 700 outputs the read strobe signal read_strobe and page address strobe signal p_add_stb in response to the strobe read signal ready. The page address strobe signal p_add_stb is supplied to the page address buffers 201, 202, 203, . . . which are, in turn, enabled by the page address strobe signal p_add_stb, thereby latching the page address signals page_address<0>, page_address<1>, page_address<2>, . . . , and thus, buffering the page address signals page_address<0>, page_address<1>, page_address<2>, . . . , respectively. The read strobe signal read_strobe is supplied to the column selection signal generator 800 which, in turn, outputs a column selection signal in synchronization with the read strobe signal read_strobe. This will be described in detail hereinafter.

First, operation of the page address buffers 201, 202, 203, . . . will be described with reference to FIG. 9 which illustrates one of the page address buffers 201, 202, 203, . . . . In the page address buffer of FIG. 9, an NMOS transistor N93 is in an OFF state before the page address strobe signal p_add_stb is enabled. Under this condition, the PMOS transistors P91 and P94 are in an ON state. Accordingly, the nodes D and E are pulled up to a high level, so that the PMOS transistors P94 and P95 are in an OFF state. As a result, the page address buffer does not perform buffering operation.

When level transition occurs in the page address signal page_address applied to the page address buffer, a signal atd_sum and a strobe ready signal ready are generated, as described above. Also, the page address strobe signal p_add_stb is enabled. In response to the enabled page address strobe signal p_add_stb applied to the page address buffer, the NMOS transistor N93 is turned on, and the PMOS transistors P91 and P94 are turned off. Accordingly, the page address buffer performs a buffering operation.

That is, when the page address signal page_address is transited to a high level, the NMOS transistor N91 is turned on, thereby causing the node D to be transited to a low level. Also, the NMOS transistor N92 is turned off. In response to a signal from the node D, the PMOS transistor P93 is turned on, thereby causing the node E to be transited to a high level. Accordingly, the NMOS transistor N94 is turned on, and the PMOS transistor P95 is turned off. As a result, a page address signal page_add_out buffered to a high level is output. On the other hand, when the page address signal page_address is transited to a low level, the NMOS transistor N92 is turned on, thereby causing the node E to be transited to a low level. Also, the NMOS transistor N91 is turned off. In response to a signal from the node E, the PMOS transistor P95 is turned on. Accordingly, a page address signal page_add_out buffered to a low level is output. A latch 901 is included in the page address buffer, in order to latch a signal at the node G for a predetermined time.

Thus, each of the page address buffers 201, 202, 203, . . . is enabled by the page address strobe signal p_add_stb, and buffers the associated page address signal page_address by latching the page address signal page_address.

The page address signals page_add_out respectively outputted from the page address buffers 201, 202, 203, . . . are applied to the page address decoder 400 which, in turn, decodes the page address signals page_add_out, thereby Outputting decoded page address signals decoded_address<0>, decoded_address<1>, decoded_address<2>, . . . , as shown in FIG. 3.

Finally, the column selection signal generator 800 outputs column selection signals Yi<0>, Yi<1>, . . . respectively corresponding to the decoded page address signals decoded_address<0>, decoded_address<1>, decoded_address<2>, . . . . Each of the column selection signals Yi<0>, Yi<1>, . . . is generated in synchronization with the read strobe signal read_ strobe, namely, the enabled period of the read strobe signal read_strobe.

Thus, a page address strobe signal and a read strobe signal are newly generated every time level transition occurs in one or more page address signals, to generate a column selection signal using the generated signals. Accordingly, there is no phenomenon that two different column signals are generated for one read strobe signal.

That is, when level transition occurs in one or more page address signals due to skew occurring for the page address signals during outputting of a column selection signal, a page address strobe signal and a read strobe signal are newly generated in accordance with detection of the level transition. In this case, the page address buffers re-latch the associated page address signals using the page address strobe signal, thereby buffering the page address signals. The page address decoder decodes the buffered page address signals. Finally, the column selection signal generator generates column selection signals respectively corresponding to the decoded page address signal in synchronization with the newly generated read strobe signal. Thus, in accordance with the present invention, only one column selection signal is output for one read strobe signal, as shown in FIG. 12. Accordingly, it is possible to fundamentally prevent an erroneous data read operation caused by simultaneous selection of two different columns.

As apparent from the above description, a column path circuit which newly performs latching and decoding of page address signals input from the outside of the column path circuit when level transition of at least one of the page address signals occurs in an enable period of a read strobe signal due to skew occurring for the page address signals, and re-generating a read strobe signal, to generate column selection signals, thereby preventing two different column selection signals from being generated for one read strobe signal. Thus, a normal data read operation can be achieved in accordance with the present invention.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A column path circuit comprising:
a ready signal generator which outputs a strobe ready signal having a predetermined enable period in response to the level transition of page address signals;
a reset signal generator which outputs a reset signal for generation of a read strobe signal and a page address strobe signal in response to the strobe ready signal;
a read strobe output unit which outputs the read strobe signal and the page address strobe signal in response to the reset signal; and
a column selection signal generating circuit which latches the page address signals, buffers the page address signals in response to the page address strobe signal and outputs column selection signals respectively corresponding to a decoded page address signals in response to the read strobe signal.

2. The column path circuit according to claim 1, wherein the reset signal generator comprises:
a pull-down device which pulls down a predetermined node in response to a signal obtained in accordance with delay of the page address strobe signal fed back to the pull-down device;
a first pull-up device which pulls up the node in response to an inverted signal of the read strobe signal fed back to the first pull-up device;
a first logic unit which applies a logical operation on a signal from the node and the strobe ready signal; and
a signal generator which generates the reset signal in response to a signal outputted from the first logic unit, the reset signal having a predetermined enabled period.

3. The column path circuit according to claim 2, wherein the reset signal generator further comprises:
a latch which is arranged between the node and the first logic unit, and latches the signal from the node for a predetermined time.

4. The column path circuit according to claim 2, wherein the reset signal generator further comprises:
a switch device which performs switching between the node and the pull-down device in response to the inverted signal of the read strobe signal.

5. The column path circuit according to claim 4, wherein the switch device is an n-channel metal oxide semiconductor (NMOS) transistor.

6. The column path circuit according to claim 2, wherein the first logic unit logical operation comprises an ANDing operation.

7. The column path circuit according to claim 2, wherein the signal generator comprises:
a delay which delays the signal outputted from the first logic unit for a predetermined time;
a buffer which buffers a signal outputted from the delay; and
a second logic unit which applies a logical operation on the signal outputted from the first logic unit and a signal outputted from the buffer.

8. The column path circuit according to claim 7, wherein the buffer performs an inverting operation, and the second logic unit logical operation comprises an ANDing operation.

9. The column path circuit according to claim 2, wherein the reset signal generator further comprises:
a second pull-up device which pulls up the node in response to a predetermined initialization signal.

10. The column path circuit according to claim 1, wherein the read strobe output unit comprises:
- a pull-down device which pulls down a predetermined node in response to the reset signal;
- a first pull-up device which pulls up the node in response to an inverted signal of the read strobe signal fed back to the first pull-up device;
- a latch which latches a signal from the node for a predetermined time;
- a signal generator which outputs the page address strobe signal having a predetermined enabled period in response to a signal outputted from the latch; and
- a first delay which delays the page address strobe signal for a predetermined time, and outputs the delayed page address strobe signal as the read strobe signal.

11. The column path circuit according to claim 10, wherein the read strobe output unit further comprises:
- a switch device which performs switching between the node and the pull-down device in response to the inverted signal of the read strobe signal.

12. The column path circuit according to claim 11, wherein the switch device is an n-channel metal oxide semiconductor (NMOS) transistor.

13. The column path circuit according to claim 10, wherein the latch is an inverting latch which inverts the signal from the node, and outputs the inverted signal.

14. The column path circuit according to claim 10, wherein the signal generator comprises:
- a second delay which delays the signal outputted from the latch for a predetermined time;
- a buffer which buffers a signal outputted from the second delay; and
- a logic unit which performs a logic operation on the signal outputted from the latch and a signal outputted from the buffer.

15. The column path circuit according to claim 14, wherein the buffer performs an inverting operation, and the logic unit logic operation comprises an ANDing operation.

16. The column path circuit according to claim 10, wherein the read strobe output unit further comprises:
- a second pull-up device which pulls up the node in response to a predetermined initialization signal.

17. The column path circuit according to claim 1, wherein the ready signal generator comprises:
- a pull-down device which pulls down a node in response to the level transition of page address signals;
- a first pull-up device which pulls up the node in response to an inverted signal of the reset signal; and
- a latch which latches a signal from the node for a predetermined time, and outputs the latched signal as the strobe ready signal.

18. The column path circuit according to claim 17, wherein the ready signal generator further comprises:
- a switch device which performs switching between the node and the pull-down device in response to the inverted signal of the reset signal.

19. The column path circuit according to claim 18, wherein the switch device is an n-channel metal oxide semiconductor (NMOS) transistor.

20. The column path circuit according to claim 17, wherein the latch is an inverting latch which inverts the signal from the node, and outputs the inverted signal.

21. The column path circuit according to claim 17, wherein the ready signal generator further comprises:
- a second pull-up device which pulls up the node in response to a predetermined initialization signal.

* * * * *